United States Patent
Byers et al.

(10) Patent No.: US 6,906,407 B2
(45) Date of Patent: Jun. 14, 2005

(54) FIELD PROGRAMMABLE GATE ARRAY ASSEMBLY

(75) Inventors: Charles Calvin Byers, Wheaton, IL (US); Richard J. Coyle, Lawrenceville, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 10/191,827

(22) Filed: Jul. 9, 2002

(65) Prior Publication Data

US 2004/0007768 A1 Jan. 15, 2004

(51) Int. Cl.[7] .............................................. H01L 23/02
(52) U.S. Cl. ...................... 257/686; 257/685; 257/700; 257/777; 257/778
(58) Field of Search ................................ 257/685–686, 257/700, 777, 778

(56) References Cited

U.S. PATENT DOCUMENTS

| | | | | |
|---|---|---|---|---|
| 5,376,825 A | * | 12/1994 | Tukamoto et al. | 257/685 |
| 5,838,061 A | * | 11/1998 | Kim | 257/686 |
| 6,093,029 A | * | 7/2000 | Kwon et al. | 439/69 |
| 6,380,615 B1 | * | 4/2002 | Park et al. | 257/686 |
| 6,476,476 B1 | * | 11/2002 | Glenn | 257/686 |
| 6,541,991 B1 | * | 4/2003 | Hornchek et al. | 324/755 |
| 6,801,440 B2 | * | 10/2004 | Inoue et al. | 361/803 |
| 2002/0086459 A1 | * | 7/2002 | Nakajima | 438/106 |
| 2003/0013231 A1 | * | 1/2003 | Val | 438/109 |
| 2003/0155649 A1 | * | 8/2003 | Wood et al. | 257/723 |

* cited by examiner

Primary Examiner—Amir Zarabian
Assistant Examiner—Ida M. Soward

(57) ABSTRACT

A field programmable gate array assembly (100, 200, 300) offers the unique functionality typically reserved for custom ICs and application specific integrated circuits (ASICs) with the flexibility of a programmable gate array. This is accomplished by modifying a package for a programmable IC (102), such as a programmable gate array, to electrically and mechanically couple to another IC (104). The preferred electrical and mechanical coupling occurs by stacking the IC on the programmable IC.

19 Claims, 2 Drawing Sheets

FIELD PROGRAMMABLE GATE ARRAY ASSEMBLY

FIELD OF THE INVENTION

The present invention relates to the field of integrated circuits (ICs) and in particular to the field of application specific integrated circuits (ASICs) and field programmable gate arrays (FPGAs).

BACKGROUND OF THE INVENTION

Application specific integrated circuits (ASICs) offer the electronics designer the ability to customize standard integrated circuits (ICs) to provide a unique set of performance characteristics by integrating complex functionality and input/output (I/O) on a single integrated circuit (IC). The significant benefits regarding the use of ASICs are customization, the ability to create unique functionality, and economies of scale for devices destined to be mass-produced. Alternative devices, such as, for example, field programmable gate arrays (FPGAs) permit the digital logic designer access to standard digital logic functions and capabilities, and additionally allow certain functions and I/O to be programmed rather than fixed during production. Programmability offers the advantages of greater design flexibility and faster product implementation during subsequent system development efforts. Furthermore, for purposes of low volume applications and the creation of prototype units, FPGAs typically exhibit lower unit costs than do ASICs. Even though FPGAs are highly flexible (e.g., programmable I/O) and under certain circumstances exhibit lower unit costs, they nevertheless fall short of the primary benefits offered by ASIC's, namely, customization, diverse function complexity and high speed. Also, a circuit technology used for an FPGA may not be suitable to implement a certain feature, for example, a feature requiring a semiconductor technology that is different from the technology used to implement the FPGA. Such specialized features are typically implemented as a standard or special purpose integrated circuit.

Accordingly, there exists a need for an integrated circuit (IC) or a class of ICs that offers the customization and functional diversity of an FPGA combined with another IC that has special characteristics that are not readily implemented on the FPGA.

SUMMARY OF THE INVENTION

The need is met and an advance in the art is accomplished by a new class of integrated circuit assemblies in accordance with the present invention. In particular a programmable integrated circuit (IC) is combined with an integrated circuit or other device to offer the flexibility of programmability with functionality and/or electrical performance characteristics typically unavailable in a programmable IC.

In accordance with one aspect of the invention, the programmable IC is a field programmable gate array (FPGA) while the other IC or device is selected from components that may not be well suited to be emulated by but rather are suitable for integration with the FPGA. Alternatively, the other IC or device uses semiconductor processes or materials that are different from or incompatible with the FPGA. Exemplary functions for the other IC or device are random access memory, flash memory, disk drive circuitry, print head circuitry, analog signal processing, digital signal processing, optical interface circuitry, energy storage, radio frequency circuitry, amplification, accelerometry, gyroscope circuitry, gas chromatography, mass spectrometry, and global positioning.

In accordance with an aspect of the invention, the programmable IC package has a first surface with a plurality of conductive interconnects provided thereon. The programmable IC package also has a second surface opposite the first surface with a plurality of conductive interconnects. The interconnects provided on the first surface are used to couple the integrated circuit to the programmable IC. The interconnects provided on the second surface are used to couple the programmable IC to another level of assembly, such as a printed circuit board. A coupler provides electromechanical coupling between the IC and the programmable IC. In yet a further aspect of the invention, the coupler is detachable to facilitate decoupling the IC from the programmable IC.

DESCRIPTION OF THE PREFERRED EMBODIMENTS

Figure 1:
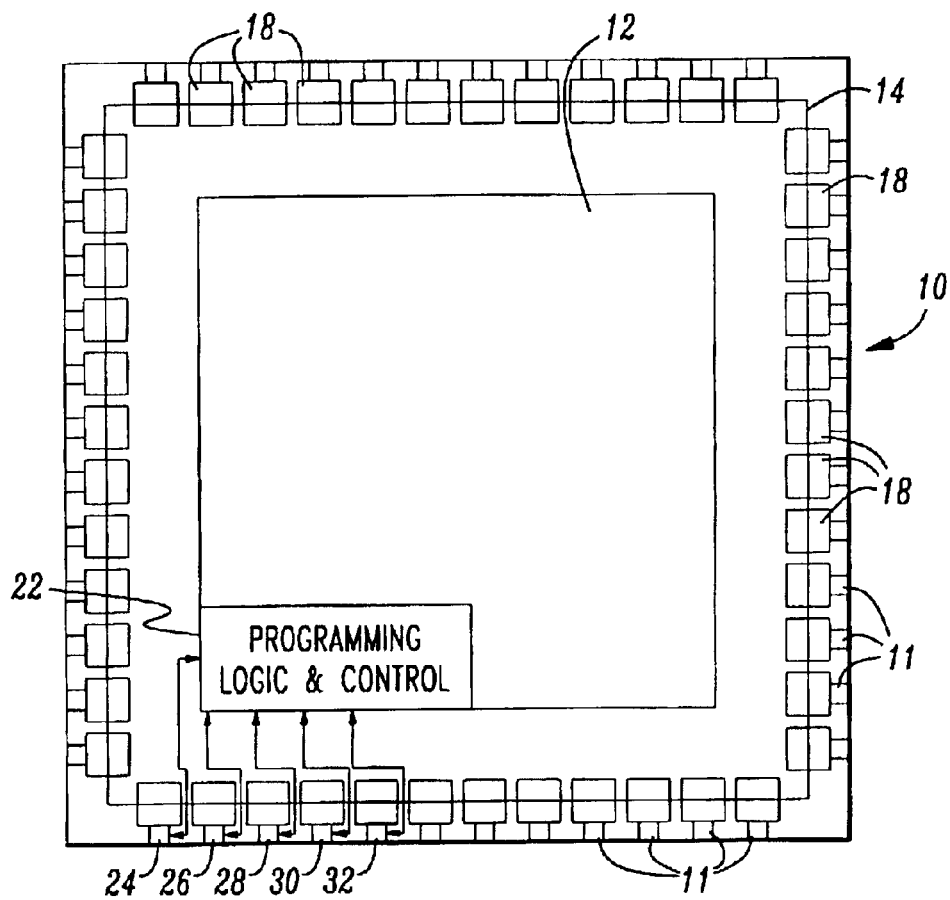
FIG. 1 is a schematic top view of a field programmable gate array (FPGA) die.

FIG. 1 is a schematic top view of a programmable integrated circuit (IC) die 10, such as, for example, a die for a field programmable gate array (FPGA). A functional core 12 is shown in the center of die 10. Bonding pads 11, which are also called I/O pads, are provided along a perimeter of die 10. Each bonding pad is coupled to a programmable I/O cell 18. Programmable I/O cells 18 provide the interface for programming the function and characteristics for the inputs and outputs of die 10. Functional core 12 includes a predetermined number of digital logic gates and cells for configuring the logic gates. Functional core 12 also includes a programming logic and control section 22 that is used to configure the internal cells, logic gates and I/O cells. Routing layers 14 provide signal paths (not shown) between programmable I/O cells 18 and functional core 12. Programming control is accomplished through pads 24, 26, 28, 30 and 32. Programmable gate arrays (PGAs) and other programmable ICs like the one depicted in FIG. 1 have in the past been available from companies like Altera, Xilinx Inc., and InnovASIC, Inc.

The I/O pads 18 of the die 10 can be programmed to support different logic types, such as, but not limited to, TTL, CMOS, BiCMOS, and Schmitt trigger. I/O pads 18 can also be programmed for selectable electrical characteristics such as power and ground. In addition I/O pads 18 can be programmed as inputs, outputs, and bidirectional input/outputs. Functional core 12 is programmable to implement a plethora of digital logic functions. As such, the programmable IC die 10 may be programmed to be form-compatible, fit-compatible, and function-compatible with an existing digital integrated circuit for purposes of emulation and/or cloning the existing digital integrated circuit. In addition, a totally new digital integrated circuit is readily created using programmable IC die 10.

Figure 2:
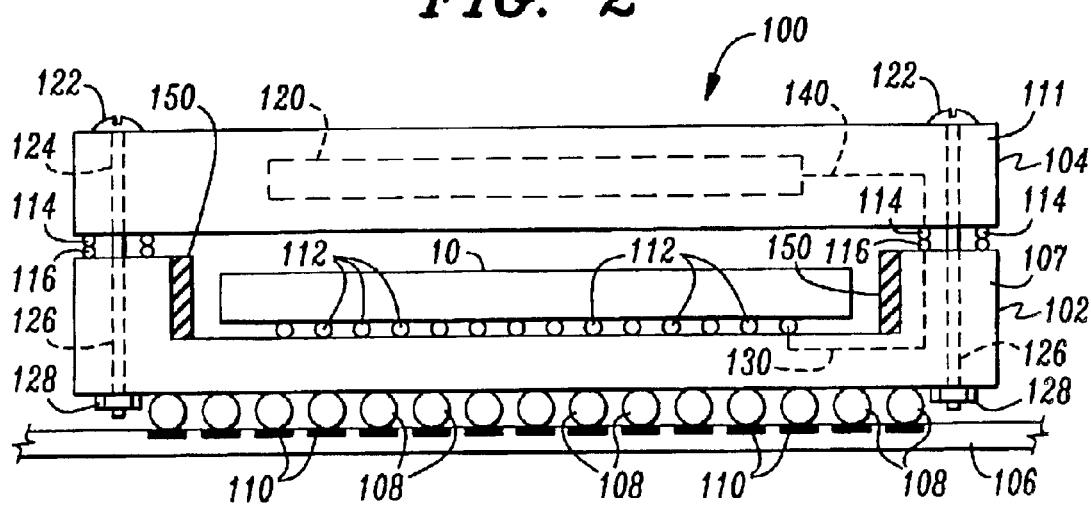
FIG. 2 is a schematic sectional view of a gate array assembly in accordance with the present invention, wherein two integrated circuits are coupled together via screws.

FIG. 2 is a schematic sectional view of a gate array assembly 100 in accordance with the present invention. Gate array assembly 100 includes a bottom integrated circuit 102 and a top integrated circuit 104. In accordance with the invention, bottom integrated circuit 102 and top integrated circuit 104 are electrically and mechanically coupled together. Preferably, bottom integrated circuit 102 is a field programmable gate array. Alternatively, bottom integrated circuit 102 is a programmable gate array, laser programmable gate array, programmable array logic, or gate array logic. Preferably, top integrated circuit 104 is a special purpose integrated circuit that provides a function that is not readily integrated into bottom integrated circuit 102. Exemplary functions that are partially or completely implemented using top integrated circuit 104 include print heads; disk drives; analog signal processors; optical interfaces such as wavelength division multiplexers (WDMs); energy generation, conversion, and storage devices such as, but not limited to batteries, fuel cells, inverters, and regulators; radio frequency (RF) components such as electrodes, antennas, oscillators, frequency synthesizers, transmitters, receivers, amplifiers, mixers, modulators, demodulators, encoders, decoders, filters; and sensors such as, but not limited to accelerometers, gyroscopes, gas chromatographs, mass spectrometers, sensors that detect environmental phenomenon such as temperature, humidity, pressure, and global positioning, and sensors that detect biological phenomenon, including fingerprint identification and retina identification. The exemplary functions for top integrated circuit 104 listed above may be implemented using devices other than traditional integrated circuits. Top integrated circuit 104 may use a semiconductor technology, e.g., gallium arsenide, that is diverse from a semiconductor technology, e.g., silicon, employed in bottom integrated circuit 102. The semiconductor technologies may include InAlGaP, SiC, LiNo, polymers and others. Gate array assembly 100 provides, in a single IC footprint, a class of ICs that offers the customization and functional diversity of an FPGA combined with another IC that has special characteristics that are not readily implemented on the FPGA.

As shown in FIG. 2, gate array assembly 100 is readily electromechanically coupled to a next level of assembly, in the case of FIG. 2, a printed circuit board 106. More specifically, bottom integrated circuit 102 includes a cavity-up ball grid array package 107. Solder balls 108 electromechanically couple bottom integrated circuit 102 to printed circuit board 106. Conductive pads 110 are provided on printed circuit board 106 for electromechanically coupling bottom integrated circuit 102 to printed circuit board 106 and other circuits coupled to printed circuit board 106. Package 107 has complementary conductive pads (not shown) that are coupled to solder balls 108. Although bottom integrated circuit 102 has a ball grid array package, any package technology, for example, through-hole technology and leaded surface mount technology, is readily applied for coupling bottom integrated circuit 102 to printed circuit board 106. In addition, although package 107 is shown in FIG. 2 as having an exposed die 10, a package with a lid or with a material to encapsulate die 10 is readily used. In some cases, a lid may be used for providing additional surface area for coupling bottom integrated circuit 102 to top integrated circuit 104. Similarly, the materials used for packaging are not limited and may include, plastic and ceramics. Package styles are not limited and may include dual-in-line packages, leadless chip carriers and the like Programmable integrated circuit die 10 is coupled to package 107 in a flip chip style via solder balls 112. Electrical coupling between a bonding pad 11 of die 10 and I/O pads of package 107 are provided in any known manner. Preferably, package 107 is a laminate substrate with routing for connecting I/O pads of package 107 with I/O pads on die 10. The laminate substrate may have multiple layers.

Top integrated circuit 104 includes a package 111. Package 111 may be soldered to package 107. Solder balls 114 and 116 show schematically a solder connection between package 107 and package 111. In practice, a single set of solder balls, either 114 or 116, is preferred. Preferably the solder connection on a top surface of package 107, illustrated as solder balls 116, also provides electrical conductivity to an I/O pad on die 10, as illustrated by trace 130. Similarly, an electrical connection is provided between die 120 of top integrated circuit 104 and conductive pads available on a surface of package 111 and coupled to solder balls 114, as illustrated by trace 140. That is, solder balls 114 and 116, which are on a bottom surface of top integrated circuit 104 and a top surface of bottom integrated circuit 102, respectively, provide for electrical coupling between functions implemented on die 120 of top integrated circuit 104 and functions implemented on die 10 of bottom integrated circuit 102.

Preferably, bottom integrated circuit 102 and top integrated circuit 104 are mechanically coupled together. In addition to the coupling provided by a solder connection illustrated by solder balls 114 and 116, screws 122 mechanically couple top integrated circuit 104 to bottom integrated circuit 102. More specifically, screws 122 are provided through holes 124 in package 111 and holes 126 in package 107 to couple top integrated circuit 104 to bottom integrated circuit 102. Holes 124, 126 are alternatively, threaded for receiving screw 122 or not threaded. Where holes 124, 126 are not threaded, a nut 128 may be provided for securing screws 122 in place. The number of screws and the location of the screws may vary. In a preferred embodiment, four screws are located at each corner of the gate array assembly.

Where a mechanical connection is used to couple bottom integrated circuit 102 to top integrated circuit 104, package warpage becomes an issue. A copper stiffener ring 150 is preferably employed in bottom integrated circuit 102 around the cavity that holds die 10 to constrain the package to prevent warpage. The mechanical interconnection preferably compensates for 8 mil deviations in flatness, including the so-called potato chipping effect that often occurs across large laminate packages.

There are several alternatives for coupling bottom integrated circuit 102 to top integrated circuit 104. In particular, balls 116 and 114 need not be solder connections, but may simply be conductive pads or bumps that provide electrical coupling due to contact. Alternatively, a conductive paste may be used to connect bottom integrated circuit 102 to top integrated circuit 104. Or, wire ball technology or a conductive elastomer may be used to couple bottom integrated circuit 102 to top integrated circuit 104. Where a soldering process is used to connect bottom integrated circuit 102 to top integrated circuit 104, the soldering process for coupling top integrated circuit 104 to bottom integrated circuit 102 is preferably done after bottom integrated circuit 102 is coupled to the next level of assembly. The process for soldering bottom integrated circuit 102 to top integrated circuit 104 may be done using a single side repair tool and a low temperature solder to prevent reflow of the soldered connections between bottom integrated circuit 102 and printed circuit board 106.

In operation, bottom integrated circuit 102 is programmed in a manner to implement a predetermined function, including the assignment of functionality to each I/O pad as a power, ground, input, output or bi-directional pad. In addition, in accordance with the invention, I/O pads with conductivity to a top surface of bottom component 102 are provided. The I/O connectivity provided on the top surface of bottom integrated circuit 102 includes power, ground, inputs, outputs or bidirectional pads for functional compatibility with top integrated circuit 104.

Figure 3:
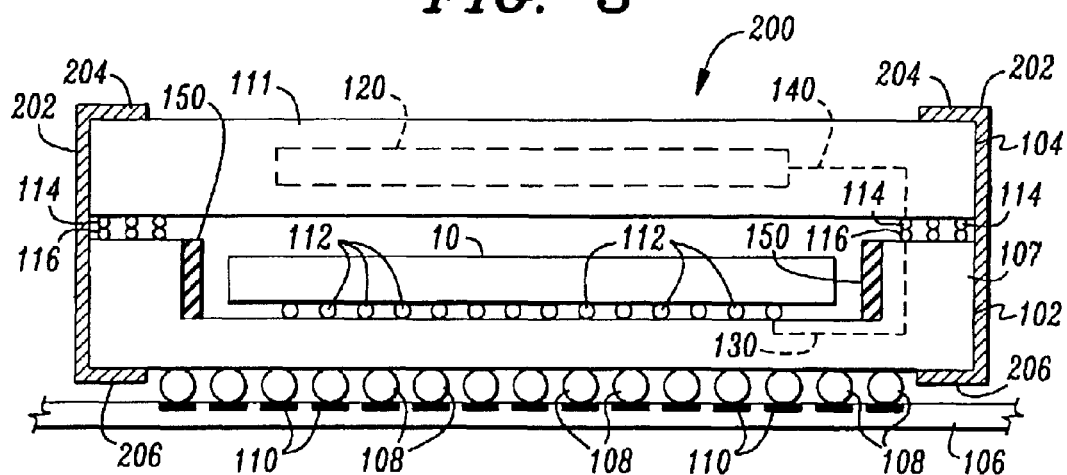
FIG. 3 is a schematic sectional view of an alternate embodiment of a gate array assembly in accordance with the present invention, wherein two integrated circuits are coupled together via clamps.

FIG. 3 is a schematic sectional view showing an alternate embodiment of a gate array assembly 200 in accordance with the present invention. Gate array assembly 200 illustrates an alternate mechanical connection for coupling bottom integrated circuit 102 to top integrated circuit 104. In particular, rather than using screws, clamps 202 are provided to mechanically couple bottom integrated circuit 102 to top integrated circuit 104. Clamps 202 include arms 204 and arms 206. Arms 204 and 206 are opposite each other and preferably are resilient. Most preferably, arms 204 and 206 are normally biased towards each other, thereby providing a force to hold bottom integrated circuit 102 in contact with top integrated circuit 104. Clamps 202 may vary in dimension and may be used on two or more sides of the integrated circuits.

Figure 4:
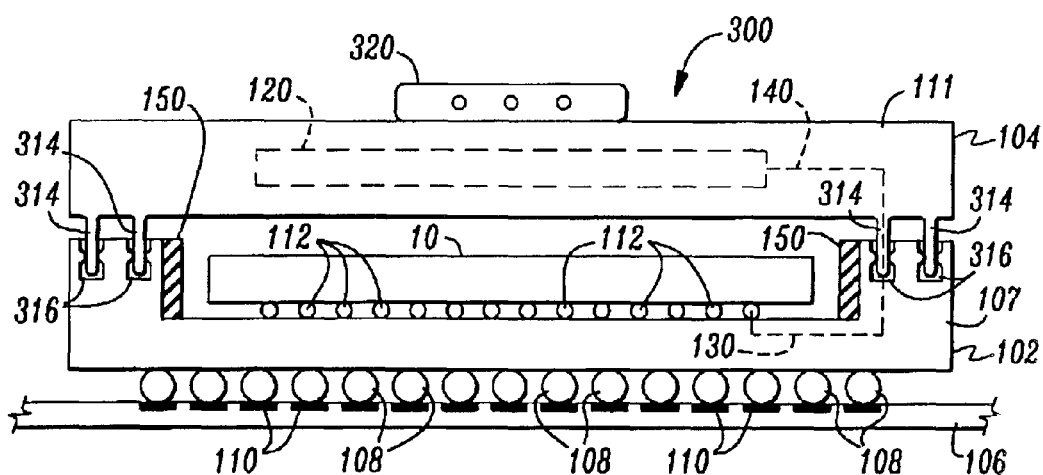
FIG. 4 is a schematic sectional view of another embodiment of a gate array assembly in accordance with the present invention, wherein a pin-and-socket arrangement couples two integrated circuits.

FIG. 4 is a schematic sectional view showing another alternate embodiment of a gate array assembly 300 in accordance with the present invention. Gate array assembly 300 illustrates an alternate electromechanical connection for coupling bottom integrated circuit 102 to top integrated circuit 104. In particular, rather than using screws or clamps, a pin and socket arrangement is used to both mechanically and electrically couple top integrated circuit 104 to bottom integrated circuit 102. More specifically, pins 314 are provided at a bottom surface of package 111 of top integrated circuit 104. Pins 314 provide an electrical connection to die 120, as illustrated by trace 140. In a complementary manner, sockets 316 are provided at a top surface in package 107 of bottom integrated circuit 102. The sockets 316 are electrically coupled to die 10, as illustrated by trace 130.

FIG. 4 also shows an I/O connector 320 attached to top integrated circuit 104. I/O connector 320 preferably provides peripheral access to functions on top integrated circuit 104. Exemplary functions or devices include optical fibers, free space optics, radio frequency, fluids and gas. In alternate embodiments, rather than continue the stack of devices with I/O connector 320, as shown in FIG. 4, additional integrated circuits or devices are stacked one on top of the other in a manner used to stack top integrated circuit 104 on bottom integrated circuit 102. One preferred such stacking arrangement includes two or more FPGAs stacked one on top of the other with another device stacked on and coupled to the top most FPGA.

In some embodiments of the invention disclosed above and shown in the figures, the top integrated circuit 104 is readily detachable from the bottom integrated circuit 102. That is, the coupling between the integrated circuits is flexibly changed. For example, the pin-and-socket arrangement shown in FIG. 4 allows the top integrated circuit 104 to be readily removed from the bottom integrated circuit 102.

Whereas the present invention has been described with respect to specific embodiments, it will be understood that various changes and modifications will be suggested to one skilled in the art and it is intended that the invention encompass such changes and modifications as fall within the scope of the appended claims.

What is claimed is:

1. An integrated circuit assembly comprising:

an integrated circuit having a plurality of conductive interconnect pads disposed on a first surface;

a programmable integrated circuit having a first and a second surface with a plurality of conductive interconnect pads disposed on the first and the second surface;

a mechanical coupler providing attachment between the integrated circuit and the programmable integrated circuit such that at least one of the plurality of conductive interconnect pads disposed on the first surface of the integrated circuit make electrical contact with at least one of the plurality of conductive interconnect pads disposed on the first surface of the programmable integrated circuit; and wherein the integrated circuit is one of: random access memory, flash memory, disk drive circuitry, print head circuitry, analog signal processing, digital signal processing, optical interface circuitry, energy storage, radio frequency circuitry, amplification, accelerometry, gyroscope circuitry, gas chromatography, mass spectrometry, and global positioning technology.

2. The assembly of claim 1 wherein the mechanical coupler is detachable.

3. The assembly of claim 2 wherein the mechanical coupler is selected from the group consisting of: clips, bolts and screws, pins and sockets.

4. The assembly of claim 1 wherein the mechanical coupler comprises one of conductive adhesive and solder.

5. The assembly of claim 1 wherein the mechanical coupler comprises one of a conductive elastomer and wire ball technology.

6. The assembly of claim 1 wherein the integrated circuit is removeably replaceable.

7. The assembly of claim 1 wherein the integrated circuit is made from a material selected from the group consisting of silicon, polymer, gallium arsenide, InAlGaP, SiC and LiNo.

8. The assembly of claim 1 wherein the programmable integrated circuit is one of: a programmable gate array, a field programmable gate array, a laser programmable gate array, a programmable array logic circuit, and a gate array logic circuit.

9. The assembly of claim 1 wherein the first surface of the integrated circuit and the first surface of the programmable integrated circuit are substantially coplanar.

10. The assembly of claim 1 wherein the plurality of conductive interconnect pads disposed on the second surface of the programmable integrated circuit provide electrical coupling to a next level of assembly.

11. An integrated circuit assembly comprising:

a first device having a plurality of conductive interconnect pads disposed on a first surface;

a field programmable gate array having a first and a second surface with a plurality of conductive interconnect pads disposed on the first and the second surface; and a detachable coupler providing electromechanical attachment between the first device and the field programmable gate array such that at least one of the plurality of conductive interconnect pads disposed on the first surface of the integrated circuit make electrical connection with at least one of the plurality of conductive interconnect pads disposed on the first surface of the field programmable gate array, and wherein the plurality of conductive interconnect pads disposed on the second surface of the field programmable gate array provide electrical coupling to a next level of assembly.

12. The assembly of claim 11 wherein the detachable coupler is selected from the group consisting of: clips, bolt, screws, pin and sockets, and electrical connectors.

13. The assembly of claim 11 wherein the field programmable gate array comprises a programmable logic device coupled to the plurality of conductive interconnect pads disposed on the first and the second surface of the field programmable gate array.

14. The assembly of claim 11 wherein the plurality of conductive interconnect pads disposed on the first and the second surface of the field programmable gate array operate as input/output pads.

15. The assembly of claim 14 wherein the input/output pads are configurable.

16. The assembly of claim 11 wherein the first surface of the first device and the first surface of the field programmable gate array are substantially coplanar.

17. The assembly of claim 11 wherein the first device is an integrated circuit.

18. The assembly of claim 11 wherein the first device is another field programmable gate array.

19. The assembly of claim 18 further comprising:
 a second device having a plurality of conductive interconnect pads disposed on a first surface;
 wherein said another field programmable gate array has a second surface with a plurality of conductive interconnect pads disposed on the second surface; and
 a second coupler providing electromechanical attachment between the second device and said another field programmable gate array.

* * * * *